United States Patent [19]

Peled et al.

[11] 3,993,890

[45] Nov. 23, 1976

[54] COMBINATORIAL DIGITAL FILTER

[75] Inventors: Abraham Peled, Pleasantville, N.Y.; Bede Liu, Princeton, N.J.

[73] Assignee: The United States of America as represented by the Secretary of the Air Force, Washington, D.C.

[22] Filed: Sept. 29, 1975

[21] Appl. No.: 618,307

[52] U.S. Cl. .................................. 235/152; 235/156
[51] Int. Cl.² ...................... G06F 15/20; G06F 7/38
[58] Field of Search ............................ 235/152, 156

[56] References Cited

UNITED STATES PATENTS

| | | | |
|---|---|---|---|
| 3,777,130 | 12/1973 | Croisier et al. | 235/152 |
| 3,822,404 | 7/1974 | Croisier et al. | 235/152 X |
| 3,950,635 | 4/1976 | Constant | 235/156 |

*Primary Examiner*—R. Stephen Dildine, Jr.
*Attorney, Agent, or Firm*—Joseph E. Rusz; William Stepanishen

[57] ABSTRACT

A combinatorial digital filter apparatus utilizing a second order filter in which bits are processed simultaneously rather than serially.

20 Claims, 2 Drawing Figures

COMBINATORIAL DIGITAL FILTER

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to digital filters and in particular to a combinatorial digital filter apparatus of the second order.

In the present state of art, digital filters have become increasingly attractive as replacements for analog filters due to recent advances in semi-conductor technology. As the speed of machine operations increase, either to permit real time processing of wideband signals or to time-share the arithmetic unit, there is a resultant rapid increase in hardware complexity, as measured by the number of IC's used, and in power consumption. The major factor causing this increase, lies with the wide spread use high speed multipliers to perform the required operations.

Researchers in the field have proposed an approach to the implementation of digital filters that is well suited to LSI construction. These technological advances center about a very efficient serial multiplier that produces a rounded binary number, and lends itself particularly well to multiplexed circuit operation. Using current TTL technology, multipliers of this type can accommodate a bit rate of approximately 25 MHz. The present invention provides a new approach for the hardware implementation of fixed point arithmetic digital filters. The new realization calls for the storing of the finite number of possible outcomes of an intermediate arithmetic operation, and using them to obtain the next output sample through repeated addition and shifting operations, thereby no multiplications are required. In addition, the present approach provides digital filters which operate at speeds that are difficult or impossible to achieve with the existing state of the art.

SUMMARY

The present invention utilizes a plurality of storage registers to store a finite number of mathematical results of an intermediate arithmetic operation which are used in repeated addition and shifting operations to provide a further output sample. The use of shift registers for data processing operations provides the flexibility of greatly increased operating speeds.

It is one object of the invention, therefore, to provide an improved digital filter apparatus to simultaneously process data bits.

It is another object of the invention to provide an improved digital filter apparatus which stores a finite number of intermediate arithmetic possibilities for further processing.

It is yet another object of the invention to provide an improved digital filter apparatus wherein repeated addition and shifting operations are utilized to process data.

These and other advantages, objects of the invention will become more apparent from the following description taken in connection with the illustrative embodiment in the accompanying drawings.

DESCRIPTION OF THE PREFERRED EMBODIMENT

Figure 1:
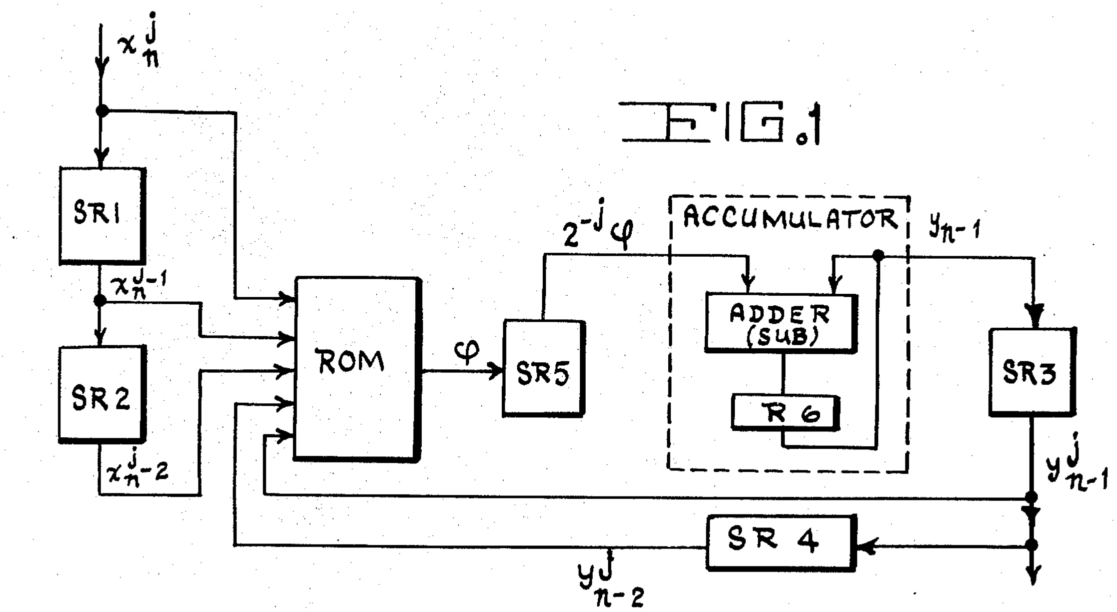
FIG. 1 is a block diagram of a combinatorial digital filter apparatus in accordance with the present invention, and, FIG. 2 is a block diagram of a second order digital filter apparatus in a high speed configuration.

The operation of the combinatorial digital filter apparatus may be approximated by an N-th order digital filter which is characterized by an input-output relationship of the form $$Y_n = \sum_{j=0}^{N} a_j x_{n-j} - \sum_{j=1}^{N} b_j Y_{n-j} \qquad (1)$$

where $\{X_n\}$ is the input sequence, $\{Y_n\}$ the output sequence, and $\{a_j\}$ $\{b_j\}$ are the filter coefficients.

It will be recognized that the filter specified by equation (1) may be constructed with a basic building block of second order sections that may be connected in either parallel or cascade. The use of the second order sections as building blocks provides many practical advantages, such as better noise performance and more stable operation. It will also be recognized that the filter specified by equation (1) include the class of nonrecursive filters for which the coefficient $\{b_i\}$ are all zero.

A second order section may be defined by an input output relationship.

$$Y_n = a_0x_n + a_1x_{n-1} + a_2x_{n-2} - b_1Y_{n-1} - b_2Y_{n-2} \qquad (2)$$

Assuming that $x_n$ and $Y_n$ are represented in the arithmetic processor in a 2's complement code, with B binary bits, including sign bit, i.e., $$x_n = -x_n^0 + \sum_{j=1}^{B-1} x_n^j 2^{-j} \quad x_n^j = 0 \text{ or } 1 \qquad (3)$$

Upon substituting equation (3) into equation (2) the following is obtained:

$$Y_n = \sum_{j=1}^{B-1} 2^{-j}(a_0x_n^j + a_1x_{n-1}^j + a_2x_{n-2}^j - b_1Y_{n-1}^j - b_2Y_{n-2}^j) - (a_0x_n^0 + a_1x_{n-1}^0 + ax_{n-1}^0 + a_2x_{n-2}^0 - b_1Y_{n-1}^0 - b_2Y_{n-2}^0) \qquad (4)$$

Defining the function with five binary arguments as follows:

$$\phi(x^1, x^2, x^3, x^4, x^5) = a_0x^1 + a_2x^2 + a_3x^3 - b_1x^4 - b_2x^5,\ x^j = 0 \text{ or } 1 \qquad (5)$$

then equation (5) may be rewritten as follows:

$$Y_n = \sum_{j=1}^{B-1} 2^{-j}\phi(x_n, x_{n-1}^j, x_{n-2}^j, Y_{n-1}^j, Y_{n-2}^j) - \phi(x_n^0, x_{n-1}^0, x_{n-2}^0, Y_{n-1}^0, Y_{n-2}^0) \qquad (6)$$

Since $x^j$ can take on only the values 0 or 1 the function $\phi$ has only $2^5 = 32$ possible values. These values may be precomputed and stored in advance in a read only memory (ROM) or random access memory (RAM), or may be determined by a combinatorial circuit, such as programmable logic array. The bits $(x_n, x_{n-1}, x_{n-2}, Y_{n-1}, Y_{n-2})$ are used either to address the ROM or RAM or as input to the combinatorial circuit. Therefore, equation (7) can be mechanized using addition/subtraction and shifting operations only. FIG. 1 depicts the block diagram of a second order section which is realized through equation (7). The block diagram shown in FIG. 1 may be implemented with commercially available intetrated circuits and/or combinations thereof (mainly shift registers, adders and ROM's or RAM's. The absence of multipliers is evident.

There is shown in FIG. 1 a block diagram of a second order digital filter apparatus in which the data is entered into shift registers SR1–SR4, with the least significant bit leading. At each shift, a new vector $(x_n^j, x_{n-1}^j, x_{n-2}^j, Y_{n-1}^j, Y_{n-2}^j)$ appears at the input of the circuit realizing $\phi$. The output $\phi$ is loaded into register R5 which is connected to one of the two inputs of the accumulator with a sign change for $j = 0$. The other input of the accumulator is hardwired to the output register (R6) with a 1 bit right shift. After B such shifts, the value in register R6 is rounded and the accumulator cleared. This rounded value is $Y_n$, which is shifted serially into SR3, and the processor is ready to compute the next sample $Y_{n+1}$.

Table 1 below gives an example of a typical second-order section and its corresponding function defined by its truth table with B = 8.

TABLE I

MEMORY MAP FOR SECOND-ORDER SECTION

| MEMORY ADDRESS | | | | | CONTENTS | | | | | | | |
|---|---|---|---|---|---|---|---|---|---|---|---|---|
| 0 | 0 | 0 | 0 | 0 | 0 | 0 | 0 | 0 | 0 | 0 | 0 | 0 |
| 0 | 0 | 0 | 0 | 1 | 1 | 1 | 0 | 0 | 0 | 1 | 1 | 0 |
| 0 | 0 | 0 | 1 | 0 | 0 | 1 | 1 | 1 | 0 | 1 | 0 | 0 |
| 0 | 0 | 0 | 1 | 1 | 0 | 0 | 1 | 1 | 1 | 0 | 0 | 1 |
| 0 | 0 | 1 | 0 | 0 | 0 | 0 | 0 | 0 | 0 | 1 | 1 | 0 |
| 0 | 0 | 1 | 0 | 1 | 1 | 1 | 0 | 0 | 1 | 1 | 0 | 0 |
| 0 | 0 | 1 | 1 | 0 | 0 | 1 | 1 | 1 | 1 | 0 | 1 | 0 |
| 0 | 0 | 1 | 1 | 1 | 0 | 0 | 1 | 1 | 1 | 1 | 1 | 1 |
| 0 | 1 | 0 | 0 | 0 | 1 | 1 | 1 | 1 | 0 | 1 | 0 | 1 |
| 0 | 1 | 0 | 0 | 1 | 1 | 0 | 1 | 1 | 1 | 0 | 1 | 1 |
| 0 | 1 | 0 | 1 | 0 | 0 | 1 | 1 | 0 | 1 | 0 | 0 | 1 |
| 0 | 1 | 0 | 1 | 1 | 0 | 0 | 1 | 0 | 1 | 1 | 1 | 1 |
| 0 | 1 | 1 | 0 | 0 | 1 | 1 | 1 | 1 | 1 | 0 | 1 | 1 |
| 0 | 1 | 1 | 0 | 1 | 1 | 1 | 0 | 0 | 0 | 0 | 0 | 1 |
| 0 | 1 | 1 | 1 | 0 | 0 | 1 | 1 | 0 | 1 | 1 | 1 | 1 |
| 0 | 1 | 1 | 1 | 1 | 0 | 0 | 1 | 1 | 0 | 1 | 0 | 1 |
| 1 | 0 | 0 | 0 | 0 | 0 | 0 | 0 | 0 | 0 | 1 | 1 | 0 |
| 1 | 0 | 0 | 0 | 1 | 1 | 1 | 0 | 0 | 1 | 1 | 0 | 0 |
| 1 | 0 | 0 | 1 | 0 | 0 | 1 | 1 | 1 | 1 | 0 | 1 | 0 |
| 1 | 0 | 0 | 1 | 1 | 0 | 0 | 1 | 1 | 1 | 1 | 1 | 1 |
| 1 | 0 | 1 | 0 | 0 | 0 | 0 | 0 | 0 | 1 | 1 | 0 | 0 |
| 1 | 0 | 1 | 0 | 1 | 1 | 1 | 0 | 1 | 0 | 0 | 1 | 0 |
| 1 | 0 | 1 | 1 | 0 | 0 | 1 | 1 | 1 | 1 | 1 | 1 | 1 |
| 1 | 0 | 1 | 1 | 1 | 0 | 1 | 0 | 0 | 0 | 1 | 0 | 1 |
| 1 | 1 | 0 | 0 | 0 | 1 | 1 | 1 | 1 | 1 | 0 | 1 | 1 |
| 1 | 1 | 0 | 0 | 1 | 1 | 1 | 0 | 0 | 0 | 0 | 0 | 1 |
| 1 | 1 | 0 | 1 | 0 | 0 | 1 | 1 | 0 | 1 | 1 | 1 | 1 |
| 1 | 1 | 0 | 1 | 1 | 0 | 0 | 1 | 1 | 0 | 1 | 0 | 1 |
| 1 | 1 | 1 | 0 | 0 | 0 | 0 | 0 | 0 | 0 | 0 | 1 | 0 |
| 1 | 1 | 1 | 0 | 1 | 1 | 1 | 0 | 0 | 0 | 1 | 1 | 1 |
| 1 | 1 | 1 | 1 | 0 | 0 | 1 | 1 | 1 | 0 | 1 | 0 | 1 |
| 1 | 1 | 1 | 1 | 1 | 0 | 0 | 1 | 1 | 1 | 0 | 1 | 1 |
| | | | | sign bit | ↑ | ↑ binary point | | | | | | |

words. In this example, $a_1 = 0.095$, $a_2 = -0.1665478$, $a_3 = 0.095$, $b_1 = 01.8080353$, and $b_2 = 0.9129197$. The five columns of the memory address correspond to the five binary arguments of the function, i.e., $(x_n^j, x_{n-1}^j, x_{n-2}^j, Y_{n-1}^j, Y_{n-2}^j)$. The first bit in the contents is the sign bit and the binary point is to the right of the sign bit. Here $\phi$ has been scaled down by 2 to avoid overflow.

Figure 2:
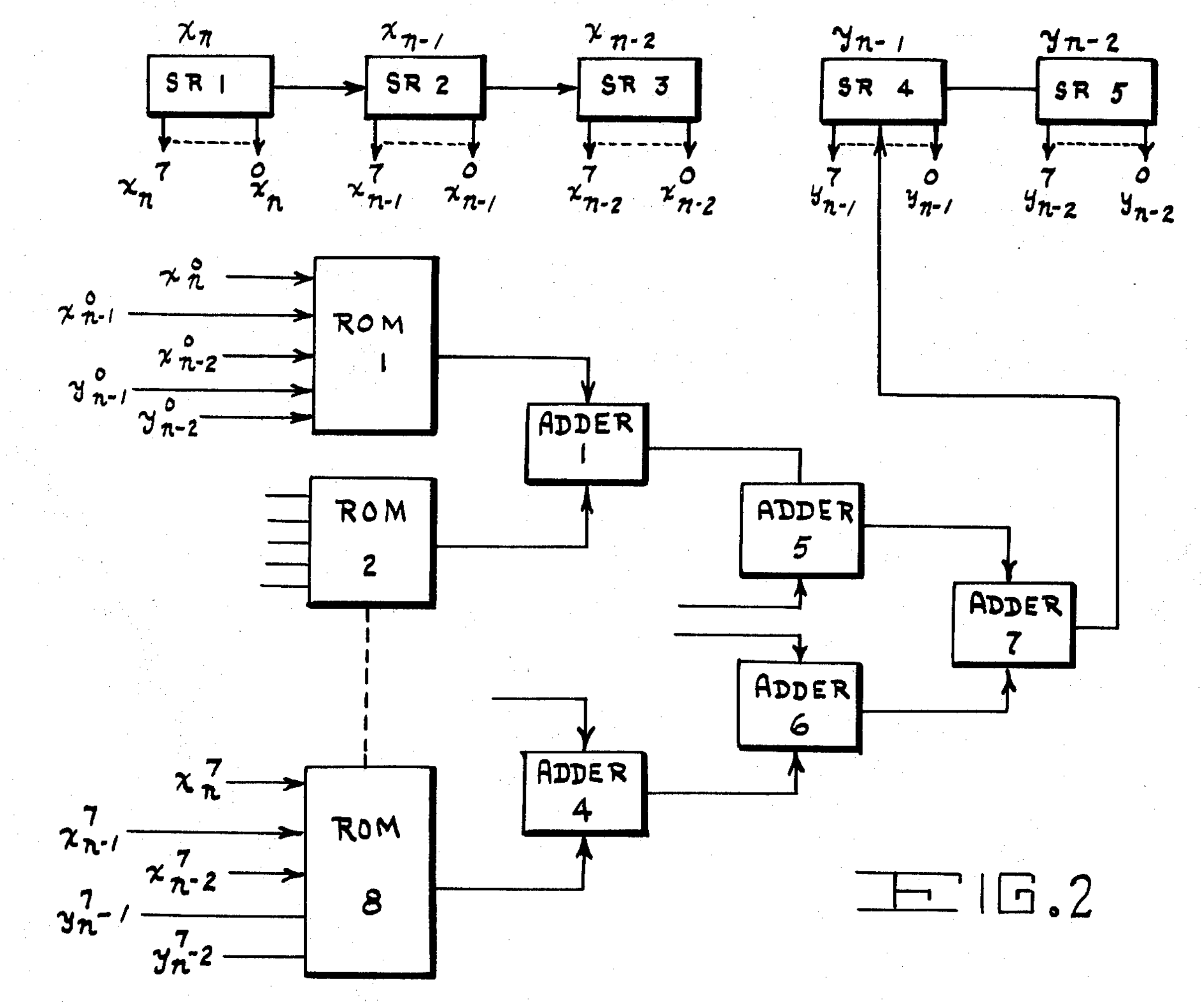

There is shown in FIG. 2 another possible mechanization equation of (7) for the case of 8 bit data. Here data are loaded in parallel into R1 to R5 and there are eight separate but identical ROM's (RAM's) storing the values of the function. The outputs of the ROM's (RAM's) 0 to 7, are added in a tree like structure with a proper number of shifts hardwired, using seven adders in this case. Thus, by providing each adder with two storage registers, concurrent (pipelining) operation of all levels is possible. It is clear from the above that the number of bits used for the data will only determine the number of levels needed and will not affect the throughput rate. For B bit data, the configuration consists of five ROM's (RAM's) and (B–1) adders.

As an example, consider B = 8. Using standard TTL IC and bipolar memory, a word rate of 20 MHz for the second order section in FIG. 2 may be achieved. The package count is 60 IX's and the power consumption 24 watts. This word rate implies that the section can operate in real time on a signal with a 10 MHz bandwidth. It should be noted that to achieve such a speed using multipliers, it would be very difficult or impossible unless several ECL multipliers are used. Such multipliers dissipate considerably more power and have a high-package count (e.g., a 9 × 9-bit multiplier performs the multiplication in 35 ns and has 36 IC's dissipating 12.6 watts). If ECL IC's are used to implement the section of FIG. 2, it is possible to realize a 50 MHz word rate, an operating speed unachievable using present multipliers. Clearly, the two mechanizations of equation (7) which are illustrated in FIGS. 1 and 2 represent two extreme cases. In the first one the data bits are processed serially, while in the second one, all data bits are processed in parallel. Configurations that fall between these two extremes are also possible by operating $k$ data bits 1 $k$ B. The resulting system will have an operating speed between 2 MHz to 20 MHz word rate with a package count between 20 IC's to 60 IC's.

The new filter structure can be used to implement directly an N-th order filter, N 2. In this case, equation (6) becomes $$Y_n = \sum_{j=1}^{B-1} 2^{-j}(x_n^j, x_{n-1}^j \ldots x_{n-N}^j, Y_{n-1}^j \ldots Y_{n-N}^j) - \phi(x_n^0, x_{n-1}^0 \ldots x_{n-N}^0, Y_{n-1}^0 \ldots Y_{n-N}^j) \quad (7)$$

where $x_k^j$, and $Y_k^j$ are the $j$-th bit of $x_k$ and $Y_k$ respectively. The function $\phi$ is a function of $2^{2N+1}$ binary arguments, defined by $$(x_n^j, x_{n-1}^j \ldots x_{n-N}^j, Y_{n-1}^j \ldots Y_{n-N}^j = \sum_{k=0}^{N} a_k x_{n-k}^j = \sum_{k=1}^{N} b_k Y_{n-k}^j \quad (8)$$

It can only take $2^{2N+1}$ possible values. These may be stored in a ROM (RAM) which is addressed by the bits $(x_n^j, x_{n-1}^j, Y_{n-1}^j \ldots Y_{n-N}^j)$. The overall filter configuration is similar to FIG. 1 but with (N+1) data registers for the input samples $(x_n)$, N data registers for the output samples $(Y_n)$ and the ROM (RAM) now has 2N+1 inputs. Similarly, it is also possible to operate several bits simultaneously and arriving at a configuration similar to that of FIG. 2 but with 2N+1 data registers and each ROM(RAM) has 2N+1 inputs.

Although the invention has been described with reference to a particular embodiment, it will be understood to those skilled in the art that the invention is capable of a variety of alternative embodiments within the spirit and scope of the amended claims.

What is claimed is:

1. A combinatorial digital filter apparatus comprising in combination:

a plurality of read only memory units to receive input data, said plurality of read only memory units providing output data, a first plurality of shift register units to receive binary data, said first plurality of shift register units utilizing said binary data to respectively provide said plurality of read only memory units with said input data, a first plurality of adder units connected to said plurality of read only memory units to process the output date therefrom, a second plurality of adder units connected to said first plurality of adder units to arithmetrically process said output data, a final adder unit connected to said second plurality of adder units to further process the addition of said output data, and a second plurality of shift register units connected to said final adder unit to provide intermediate processing of said output data, said second plurality of shift register units having an output and respectively applying said output to said plurality of read only memory units as said input data.

2. A combinatorial digital filter apparatus as described in claim 1 wherein said plurality of read only memory units equals the number of bits in the data.

3. A combinatorial digital filter unit as described in claim 1 wherein said first plurality of shift register units equals one more than the order of the filter.

4. A combinatorial digital filter apparatus as described in claim 1 wherein said second plurality of shift register units equals the order of the digital filter or less.

5. A combinatorial digital filter apparatus as described in claim 1 wherein the bits of said input data are applied in parallel to said plurality of read only memory units.

6. A combinatorial digital filter apparatus as described in claim 1 wherein said second plurality of adder units equals half the number of said first plurality of adder units.

7. A combinatorial digital filter apparatus as described in claim 6 wherein said second plurality of adder units equals two.

8. A combinatorial digital filter apparatus as described in claim 1 wherein the total number of adder units in said first plurality of adder units and said second plurality of adder units are equal to or less than the number of bits in the data minus one.

9. A combinatorial digital filter apparatus as described in claim 8 wherein said first plurality of adder units equals four.

10. A combinatorial digital filter apparatus as described in claim 9 wherein said first plurality of shift register units equals three and said second plurality of shift register units equals two.

11. A combinatorial digital filter apparatus comprising in combination:

a plurality of random access memory units to receive input data, said plurality of random access memory units providing output data, a first plurality of shift register units to receive binary data, said first plurality of shift register units utilizing said binary data to respectively provide said plurality of random access memory units with said input data, a first plurality of adder units connected to said plurality of random access memory units to process the output data therefrom, a second plurality of adder units connected to said first plurality of adder units to arithmetically process said output data, a final adder unit connected to said second plurality of adder units to further process the addition of said output data, and a second plurality of shift register units connected to said final adder unit to provide intermediate processing of said output data, said second plurality of shift register units having an output and respectively applying said output to said plurality of random access memory units as said input data.

12. A combinatorial digital filter apparatus as described in claim 11 wherein said plurality of random access memory units equals number of bits in the data.

13. A combinatorial digital filter unit as described in claim 11 wherein said first plurality of shift register units equals one more than the order of the filter.

14. A combinatorial digital filter apparatus as described in claim 11 wherein said second plurality of shift register units equals the order of the digital filter or less.

15. A combinatorial digital filter apparatus as described in claim 11 wherein the bits of said input data are applied in parallel to said plurality of random access memory units.

16. A combinatorial digital filter apparatus as described in claim 11 wherein said second plurality of adder units equals half the number of said first plurality of adder units.

17. A combinatorial digital filter apparatus as described in claim 16 wherein said second plurality of adder units equals two.

18. A combinatorial digital filter apparatus as described in claim 11 wherein the total number of adder units in said first plurality of adder units and said second plurality of adder units are equal to or less than the number of bits in the data minus one.

19. A combinatorial digital filter apparatus as described in claim 18 wherein said first plurality of adder units equals four.

20. A combinatorial digital filter apparatus as described in claim 19 wherein said first plurality of shift register units equals three and said second plurality of shift register units equals two.

* * * * *